(12) United States Patent
Kirkpatrick et al.

(10) Patent No.: US 8,043,921 B2
(45) Date of Patent: Oct. 25, 2011

(54) NITRIDE REMOVAL WHILE PROTECTING SEMICONDUCTOR SURFACES FOR FORMING SHALLOW JUNCTIONS

(75) Inventors: Brian K. Kirkpatrick, Allen, TX (US); Deborah J. Riley, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/731,913

(22) Filed: Mar. 25, 2010

(65) Prior Publication Data

US 2010/0248440 A1    Sep. 30, 2010

Related U.S. Application Data

(60) Provisional application No. 61/163,111, filed on Mar. 25, 2009.

(51) Int. Cl.
*H01L 21/336* (2006.01)
(52) U.S. Cl. ......... 438/303; 257/E21.246; 257/E21.309; 257/E21.437; 438/724; 438/757
(58) Field of Classification Search ........... 257/E21.246, 257/E21.309, E21.437; 438/303, 724, 757
See application file for complete search history.

(56) References Cited

U.S. PATENT DOCUMENTS

| 5,496,750 A | 3/1996 | Moslehi |
| 7,384,869 B2 | 6/2008 | Riley et al. |
| 2006/0094193 A1 | 5/2006 | Horstmann et al. |

*Primary Examiner* — Asok Sarkar
(74) *Attorney, Agent, or Firm* — Jacqueline J. Garner; Wade J. Brady, III; Frederick J. Telecky, Jr.

(57) ABSTRACT

A method of removing silicon nitride over a semiconductor surface for forming shallow junctions. Sidewall spacers are formed along sidewalls of a gate stack that together define lightly doped drain (LDD) regions or source/drain (S/D) regions. At least one of the sidewall spacers, LDD regions and S/D regions include an exposed silicon nitride layer. The LDD or S/D regions include a protective dielectric layer formed directly on the semiconductor surface. Ion implanting implants the LDD regions or S/D regions using the sidewall spacers as implant masks. The exposed silicon nitride layer is selectively removed, wherein the protective dielectric layer when the sidewall spacers include the exposed silicon nitride layer, or a replacement protective dielectric layer formed directly on the semiconductor surface after ion implanting when the LDD or S/D regions include the exposed silicon nitride layer, protects the LDD or S/D regions from dopant loss due to etching during selectively removing.

19 Claims, 3 Drawing Sheets

NITRIDE REMOVAL WHILE PROTECTING SEMICONDUCTOR SURFACES FOR FORMING SHALLOW JUNCTIONS

CROSS REFERENCE TO RELATED APPLICATIONS

This application and the subject matter disclosed herein claims the benefit of Provisional Application Ser. No. 61/163,111 entitled "Minimizing Silicon Loss During Disposable Spacer Removal", filed Mar. 25, 2009, which is herein incorporated by reference in its entirety.

FIELD

Disclosed embodiments relate to the fabrication of integrated circuits (ICs), and more particularly to processing that includes disposable silicon nitride layers for forming shallow junctions.

BACKGROUND

Over the past decades, the MOSFET has continually been scaled down in size. Modern CMOS integrated circuits incorporate MOSFETs with channel lengths of tens of nanometers. Smaller MOSFETs are desirable for several reasons. The principal reason is to pack more devices in a given chip area. Smaller ICs allow more chips per wafer, reducing the price per chip.

Smaller transistors also switch faster. For example, one approach to size reduction is a scaling of the MOSFET that requires all device dimensions to reduce proportionally. The main device dimensions are the transistor length, width, and the oxide thickness, and junction depths. However, for the state-of-the-art MOSFETs reduction of the transistor dimensions does not necessarily translate into higher chip speed because the RC delay due to interconnections is more significant.

Several difficulties arise due to MOSFET size reduction. The difficulties include higher subthreshold conduction, increased gate-oxide leakage, increased junction leakage, lower transconductance, lower output resistance, interconnect capacitance, and process variations.

Lightly doped drain (LDD) structures are commonly used in MOS devices. LDD technology relies on sidewall spacers to produce improved source-drain (S/D) diffusion/doping profiles that addresses some of the device difficulties described above. LDD processing comprises a series of steps where the same series of processes are repeated for each transistor being built (e.g., Low Vt NMOS, Low Vt PMOS, High Vt NMOS, and High Vt PMOS). The repeated steps typically comprise a photolithographic pattern (exposing the area to be doped), ion implantation, pattern removal, post pattern removal clean and then the process is repeated. To further improve the transistor characteristics, sidewall spacers on the gate stack of various thicknesses, optimized for forming a particular transistor, have been used. S/D processing follows LDD processing.

Regarding process variations, with MOSFETS becoming smaller, the number of atoms in the silicon that produce many of the transistor's properties is becoming fewer, with the result that control of dopant numbers and placement is more erratic. During chip manufacturing, random process variations affect all transistor dimensions including length, width, junction depths, oxide thickness etc., that become a greater percentage of overall transistor size as the transistor shrinks. The transistor characteristics become less certain and thus more variable.

Regarding processing associated with S/D doping, process variations have become increasingly problematic as S/D junction depths have reached $\leq 40$ nm which have been accompanied by increasing dopant levels at the silicon surface, particularly as S/D junctions depths have approached 15 nm. Variations in the thickness of screen dielectric for implanting into the S/D regions, for example, can result in high levels of S/D junction profile variation both locally on each IC die and from IC die to IC die. Etch of the silicon surface in the S/D regions after S/D implantation can also result in significant dopant loss that can lead to additional variation in the S/D doping profiles. Accordingly, new processes for forming S/D regions are needed that reduce process induced variation in the S/D doping profiles.

SUMMARY

Disclosed embodiments describe methods of selectively removing silicon nitride over silicon for forming shallow S/D junctions that minimize, and in some case eliminate, dopant loss in the semiconductor surface (e.g., silicon) by minimizing or eliminating etching of the silicon surface in the LDD or S/D regions following LDD or S/D implant. LDD and S/D screen nitride implant embodiments are described where the silicon nitride layer is a screen nitride that has a thin protective dielectric layer underneath that is formed on the semiconductor surface in the LDD or S/D regions. Disposable nitride spacer embodiments are also disclosed.

Eliminating or at least minimizing dopant loss in the semiconductor surface reduces process induced variation in the S/D doping profiles locally on each IC die and from IC die to IC die. Disclosed embodiments thus address the process variation induced S/D doping profile problems that as described in the Background has become increasingly problematic as S/D junction depths have reached $\leq 40$ nm, particularly as S/D junctions depths have approached 15 nm. Disclosed embodiments can also reduce semiconductor surface roughening.

DETAILED DESCRIPTION

Figure 1:
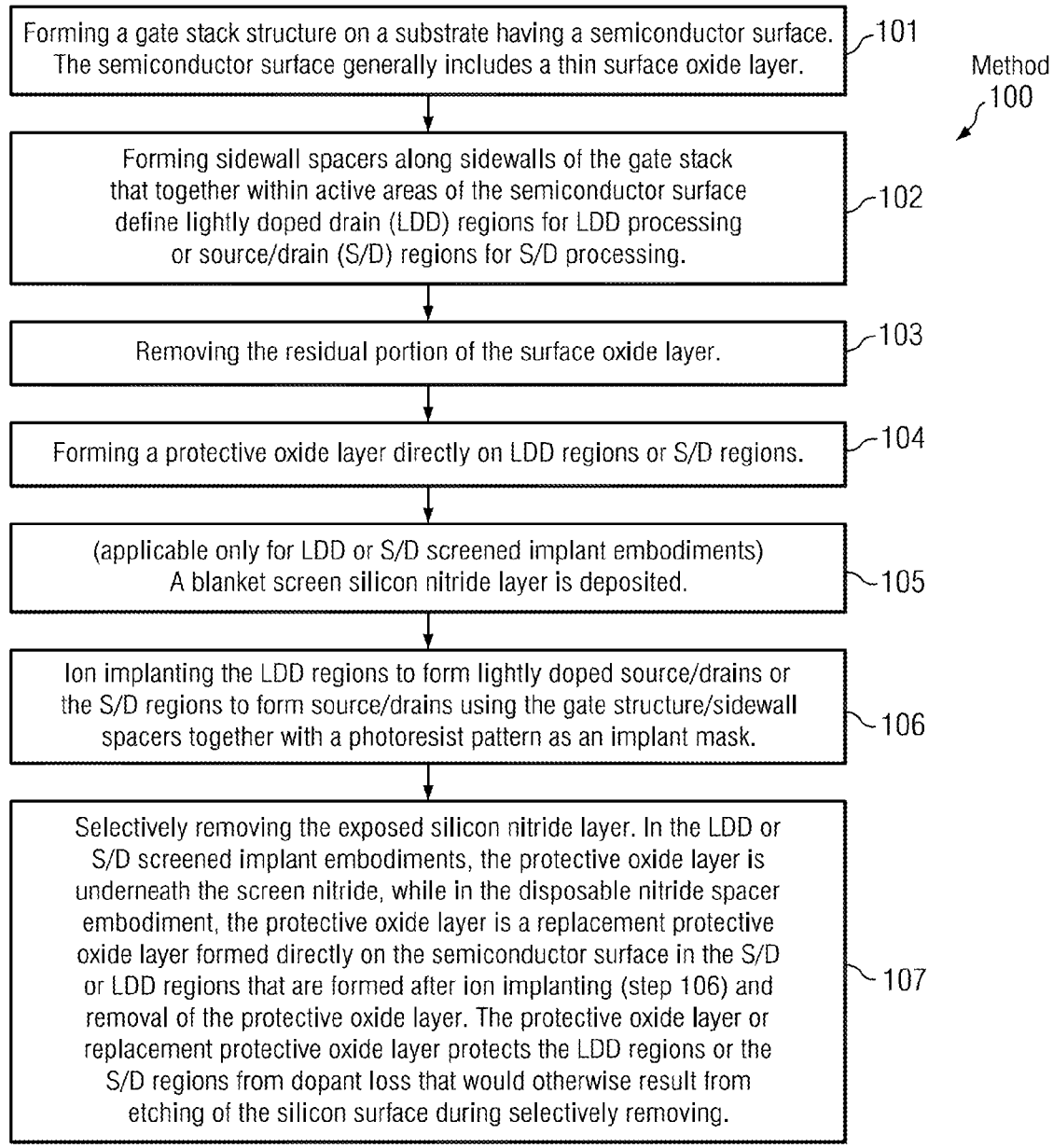
FIG. 1 shows steps in an exemplary method of selectively removing silicon nitride over a semiconductor surface for forming shallow S/D junctions that minimize, and in some case eliminate, dopant loss in the semiconductor surface, according to a disclosed embodiment.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Disclosed embodiment include methods of removing silicon nitride over semiconductor surfaces (e.g., silicon) for forming shallow S/D junctions that minimize, and in some case eliminate, dopant loss in the semiconductor surfaces. In LDD or S/D screened implant embodiments the silicon nitride layer is a screen nitride that has a thin protective dielectric layer underneath that is formed on the semiconductor surface in the LDD or S/D regions. In the disposable nitride spacer embodiment, the silicon nitride layer spacer is on the sidewalls of the gate stack while the thin protective dielectric layer is over the LDD regions or S/D regions. As used herein and unless otherwise specified, the term "silicon" refers to all forms of silicon, including but not limited to, single crystalline, crystalline, poly silicon and amorphous silicon, and certain compounds of silicon, including but not limited to, silicon germanium (SiGe) and silicon carbide (SiC). Moreover, "silicon nitride" refers to pure silicon nitride, as well as silicon nitride comprising mixtures including up to 10 atomic % oxygen, along with up to 50 atomic % silicon. Besides silicon, the semiconductor surface can comprise other semiconductors, such as, for example, Ge, GaAs, GaN, and InGaAs.

FIG. 1 shows steps in an exemplary method 100 of selectively removing silicon nitride over a semiconductor surface for forming shallow S/D junctions that minimize, and in some case eliminate, dopant loss in the semiconductor surface, according to a disclosed embodiment. In step 101 a gate stack structure comprising a gate electrode on a gate dielectric is formed on a substrate having a semiconductor surface. In one particular embodiment, the gate electrode comprises polysilicon and the dielectric layer comprises silicon oxynitride or a high-k dielectric. The sidewall of the gate electrode generally includes a sidewall dielectric, such as a sidewall oxide or amorphous carbon layer. The semiconductor surface generally includes a silicon oxide layer or amorphous carbon thereon, referred to herein as a surface dielectric layer. In the case of a polysilicon gate, the surface dielectric layer is grown on the semiconductor surface during a step referred to as a poly reox. The thickness of the surface oxide layer is generally 0.8 nm to 8 nm thick, such as 0.8 to 5 nm thick, or 0.8 to 2 nm thick.

Step 102 comprises forming sidewall spacers along sidewalls of the gate stack that together within active areas of the semiconductor surface define lightly doped drain (LDD) regions for LDD processing or source/drain (S/D) regions for S/D processing. In LDD or S/D screened implant embodiments the sidewall spacers can comprise silicon oxide, silicon nitride or silicon oxynitride. The forming generally comprises deposition then etching. As known in the art, silicon nitride can generally formed from a reaction between a silicon source ($SiH_2Cl_2$, $SiH_4$, $Si_2H_6$, BTBAS, HCD, and TSA among others) and ammonia gas.

In one embodiment the active areas are defined by trench isolation regions in the substrate, such as shallow trench isolation (STI) in the case of a bulk silicon substrate. For SOI technologies, silicon "islands" define the active area. Typically, an anisotropic etch such as reactive-ion etching (RIE) is used to form the spacers. At least one of the sidewall spacers, LDD regions and S/D regions include an exposed silicon nitride layer. For example, in the disposable nitride spacer embodiment, the nitride sidewall spacers provide the exposed silicon nitride layer. A residual portion of the surface oxide layer remains after forming the sidewall spacers.

Step 103 comprises removing the residual portion of the surface dielectric layer. Step 104 comprises forming a protective dielectric layer such as a protective oxide layer or amorphous carbon layer directly on the LDD regions or S/D regions that is generally 0.8 nm to 8 nm, such as 0.8 to 5 nm thick, or 0.8 to 2 nm thick. The protective dielectric layer can be formed using a solution-based chemical method, a deposition (e.g., atomic layer deposition (ALD), or by thermal oxidation. Step 103 and 104 can be combined in a single SC1 (i.e., $NH_4OH$, $H_2O_2$, DIW mixture). Typically, SC1 comprises 1:1:5 to 1:2:100 25 to 60° C. 1 to 10 minutes, and is operable to both remove the residual portion of the surface dielectric layer and form a protective oxide layer directly on the LDD regions or S/D regions.

Step 105 is applicable for only the LDD or S/D screened implant embodiments. In step 105, a blanket screen nitride is deposited to provide an exposed silicon nitride layer. As used herein, a "screen nitride" refers to a nitride layer used as an implant screen to randomize the implant passing therethrough to reduce planar channeling and reduce the range parameters (e.g. Rp) of the implant into the semiconductor substrate underneath. The screen nitride is generally 1 to 10 nm thick.

Step 106 comprises ion implanting the LDD regions to form lightly doped sources/drains or the S/D regions to form sources/drains using the gate structure/sidewall spacers together with a photoresist pattern as an implant mask. The total dose for the LDD implants are typically from $3E14\ cm^{-2}$ to $2E15\ cm^{-2}$ with implant energies typically selected to provide an implant peak as implanted into the semiconductor surface (e.g., silicon) $\leq 20$ nm, while the total dose for the respective S/D implants are typically from $2E15\ cm^{-2}$ to $2E16\ cm^{-2}$ with implant energies typically selected to provide an implant peak as implanted into the semiconductor surface $\leq 15$ nm.

Step 107 comprises selectively removing the exposed silicon nitride layer. In the LDD or S/D screened implant embodiments, the protective dielectric layer is underneath the screen nitride and is formed prior as described above in step 104. In the disposable nitride spacer embodiment the protective dielectric layer is a replacement protective dielectric layer formed directly on the semiconductor surface in the S/D or LDD regions that is formed after ion implanting (step 106) and removal of the protective dielectric layer. The protective dielectric layer in the LDD or S/D screened implant embodiments, and the replacement protective dielectric layer in the disposable nitride spacer embodiment protects the LDD regions or S/D regions from dopant loss that would otherwise result from etching of the semiconductor surface during selectively removing. The Inventors have estimated the dopant loss can be as much as 30% of the implanted dose for a 0.15 nm S/D junction depth process when the semiconductor surface is etched 2 to 3 nm during disposable spacer removal.

The selectively removing generally comprises a phosphoric acid etch, for example, about 70 to 95% phosphoric acid, such as 82-92% phosphoric acid at a temperature of 110-200° C., such as about 140-180° C. Hot phosphoric acid provides a high silicon nitride/silicon oxide etch selectivity, such as $\geq 50:1$. However, certain highly selective dry etches may also be possible, such as those using very low power (e.g., 50 to 200 Watts).

For example, in the disposable nitride spacer embodiment, the replacement protective dielectric layer can be formed after ion implanting (step 106), implant pattern (e.g., photoresist) removal, and removal of the protective dielectric (e.g. using dilute HF). The replacement protective dielectric layer can be formed using processes such as by solution-based chemical oxidation, depositions such as ALD, or thermal oxidation. The replacement protective dielectric layer can be 0.8 nm to 2 nm thick. Following formation of the replacement protective dielectric layer over the LDD or S/D regions, the nitride spacer is selectively removed by the selective removing process. The replacement protective dielectric layer protects the semiconductor surface from etching which can remove implanted dopant during selective removing.

In the particular case of a solution-based chemical oxidation, the chemical oxidation step to form a can be configured to oxidize the semiconductor surface in the LDD or S/D regions, but lack the oxidation power to oxidize the surface of the disposable nitride spacer. The wet chemistry for the solution-based oxidation step can comprise solutions such as SC1 (i.e., $NH_4OH$, $H_2O_2$, DIW mixture) or a sulfuric acid/hydrogen peroxide ($H_2SO_4$, $H_2O_2$) mixture, typically in a 2:1 to 20:1 ratio, in a temperature range of 85 to 180° C., for 1 to 15 minutes. Heated $H_3PO_4$+DIW mixtures have been recognized to provide greater than 50:1 selectivity between silicon nitride and silicon oxide.

Since the replacement protective dielectric layer is formed after ion implantation, some dopant loss will occur due to semiconductor surface consumption to form the replacement protective dielectric layer. However, because the semiconductor surface is protected by the replacement protective dielectric layer during nitride spacer removal, the total semiconductor loss would be limited to the semiconductor consumed in the formation of the replacement protective dielectric layer itself, only about 0.3 to 0.6 nm for a replacement protective dielectric layer thickness of about 0.7 to 1.5 nm. For example, in various embodiments, the protective dielectric layer or replacement protective dielectric layer should be able to protect an underlying semiconductor surface from attack by a hot phosphoric acid of 92% concentration at 180° C. for at least 60 minutes. Although the replacement protective dielectric layer is described above formed using a solution-based chemical oxidation, depositions such as ALD or thermal oxidation may also be used.

The method described above thus covers selective silicon nitride removal processing for (i) LDD screened implant processing, (ii) S/D screened implant processing and (iii) disposable nitride spacer for LDD or S/D processing. Although flows (i) and (ii) are described separate from (iii), these process flows may be also be practiced together. For example, the process flow for disposable nitride spacers may be integrated with the LDD screened implant and/or S/D screened implant flows. In a typical process employing disclosed embodiments, there are a plurality of serially performed LDD screened implant processes for the various transistor types to be formed (e.g., Low Vt NMOS, Low Vt PMOS, High Vt NMOS, and High Vt PMOS) using a first spacer, followed by a plurality of serially performed S/D screened implant processes for the various transistor types to be formed using a second spacer that provides a larger lateral offset from the gate edge as compared to the first spacer. As known in the art, the second spacer can be formed by adding a spacer to the first spacer, or by partially or entirely removing the first spacer and then forming the second spacer.

Figure 2:
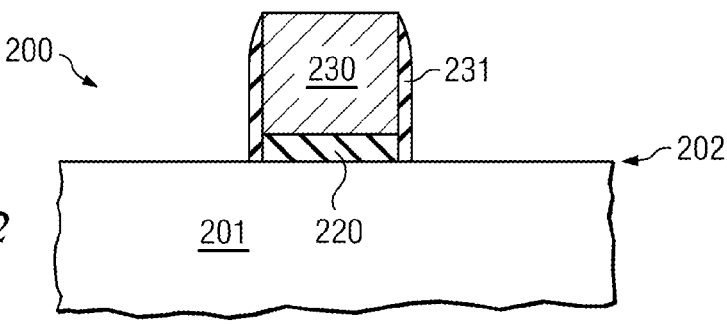
FIG. 2 depicts a cross sectional view of a gate stack structure after patterning and etching of gate electrode layer and dielectric layer using conventional lithographic methods, according to a disclosed embodiment.

FIGS. 2-10 described below provide cross sectional depictions for several disclosed embodiments. A gate stack structure is formed on a substrate having a semiconductor surface. FIG. 2 depicts a cross sectional view of a gate stack structure 200 after patterning and etching of gate electrode layer 230 and dielectric layer 220 using conventional lithographic methods. Substrate is shown as 201, while semiconductor surface is shown as 202. A sidewall dielectric 231 is shown on the sidewall of the gate structure.

Figure 3:
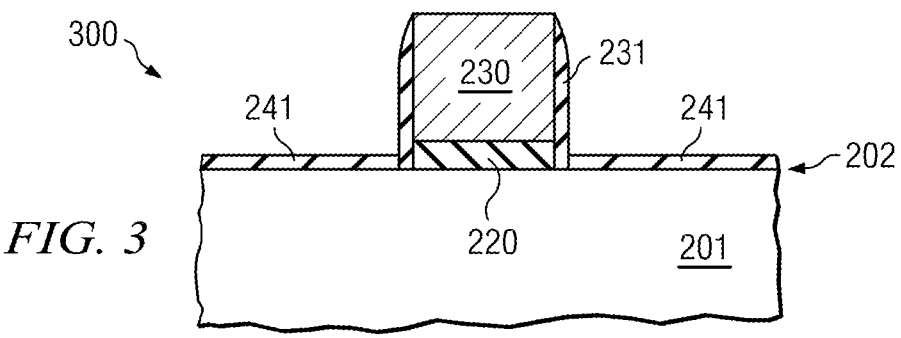
FIG. 3 depicts a cross sectional view of the resulting structure after formation of a surface dielectric layer shown on the semiconductor surface, according to a disclosed embodiment.

FIG. 3 depicts a cross sectional view of the resulting structure 300 after formation of a surface dielectric layer 241 is shown on the semiconductor surface 202. Surface dielectric layer is generally 0.8 nm to 8 nm thick.

Figure 4:
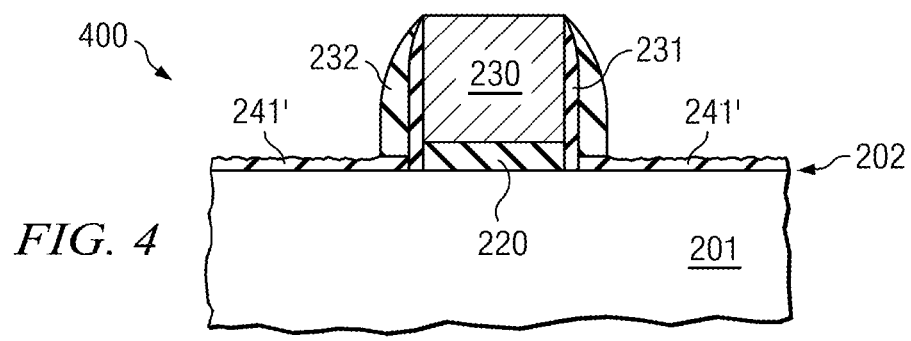
FIG. 4 depicts a cross sectional view of the resulting structure after formation of sidewall spacers, according to a disclosed embodiment.

FIG. 4 depicts a cross sectional view of the resulting structure 400 after formation of the sidewall spacers 232, such as by deposition followed by RIE or plasma etch. In the nitride spacer embodiment, spacers comprise silicon nitride. In the LDD screened implant or S/D screened implant embodiment the spacer can comprise silicon nitride, silicon oxynitride or silicon oxide. A residual portion of the surface dielectric layer 241' is shown remaining after forming the sidewall spacers. Residual portion of the surface dielectric layer 241' is shown having a jagged appearance to indicate its typical significant level of thickness non-uniformity.

Figure 5:
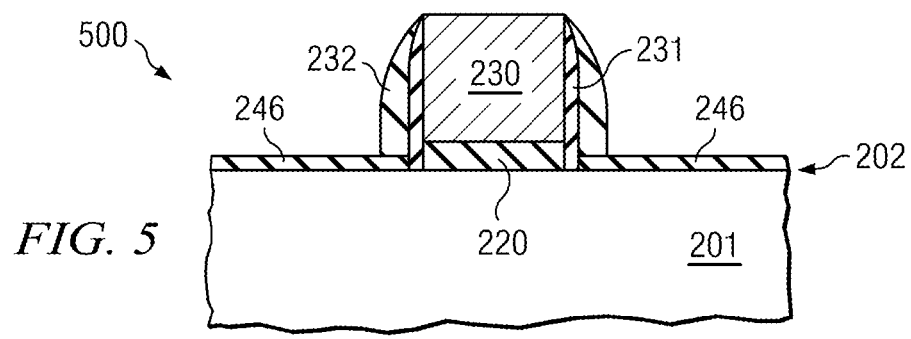
FIG. 5 depicts a cross sectional view of the resulting structure after removing the residual portion of the surface dielectric layer and forming a protective dielectric layer directly on the LDD regions or S/D regions, according to a disclosed embodiment.
Figure 6:
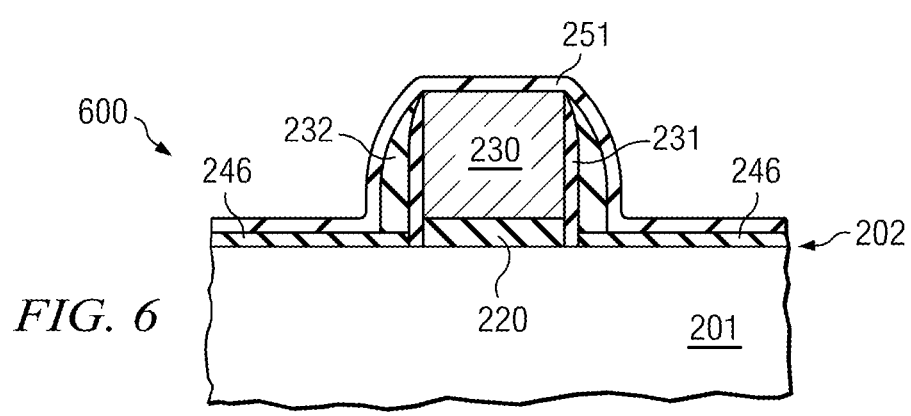
FIG. 6 depicts a cross sectional view of the resulting structure after deposition of a blanket screen nitride layer, according to a disclosed embodiment.
Figure 7:
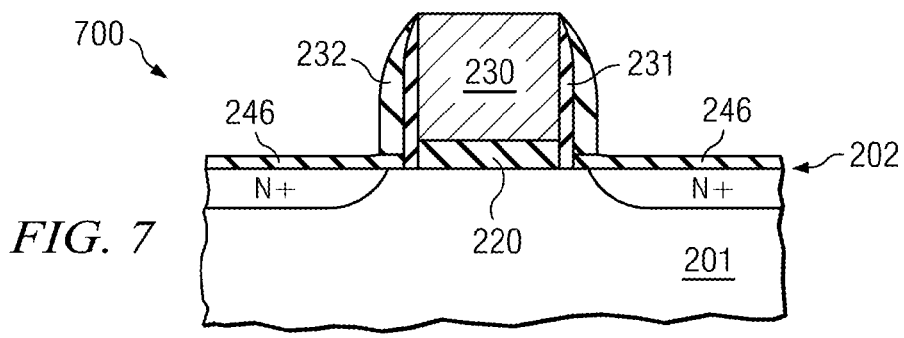
FIG. 7 depicts a cross sectional view of the resulting structure after LDD implant, pattern removal and selective removal of the screen nitride layer, according to a disclosed embodiment.

FIG. 5 depicts a cross sectional view of the resulting structure 500 removing the residual portion of the surface dielectric layer 241' and forming a protective dielectric layer 246 directly on the LDD regions or S/D regions that is generally 0.8 nm to 8 nm thick. Protective dielectric layer is a layer having uniform thickness to minimize dopant profile variation since it is implanted through to form LDD's or S/D's. FIGS. 6-7 are applicable specifically to the screen nitride embodiments. FIG. 6 depicts a cross sectional view of the resulting structure 600 after deposition of a blanket screen nitride layer 251. The thickness of the screen nitride layer 251 is generally from 3 to 8 nm. A photolithography pattern is added to selective implant only certain regions (e.g., an As implant in LDD regions for Low Vt NMOS devices) followed by the LDD implant. Pattern material (e.g., photoresist) removal follows the LDD implant.

FIG. 7 depicts a cross sectional view of the resulting structure 700 after LDD implant, pattern removal and selective removal of the screen nitride layer 251, such as by hot phosphoric acid treatment. The implanted regions are shown as N+ regions despite not yet being activated by a high temperature activation (e.g., rapid thermal anneal (RTA), flash lamp anneal (FLA), or laser scanning anneal (LSA)). As shown in FIG. 7, the etch selectivity of the process employed for removal of blanket screen nitride layer 251 is high enough to allow almost all of the protective dielectric layer 246 to remain on the semiconductor surface to avoid etching of the semiconductor surface underneath, as well as the spacer 232. As a result, generally none of the N+ implant into the semiconductor surface is removed during removal of the blanket screen nitride layer 251.

Advantages of the screen nitride embodiments include selective removal of the screen nitride after use generally without any loss of the underlying semiconductor surface. This can eliminate dopant loss in the semiconductor that reduces process induced variation in the S/D doping profiles locally on each IC die and from IC die to IC die.

Figure 8:
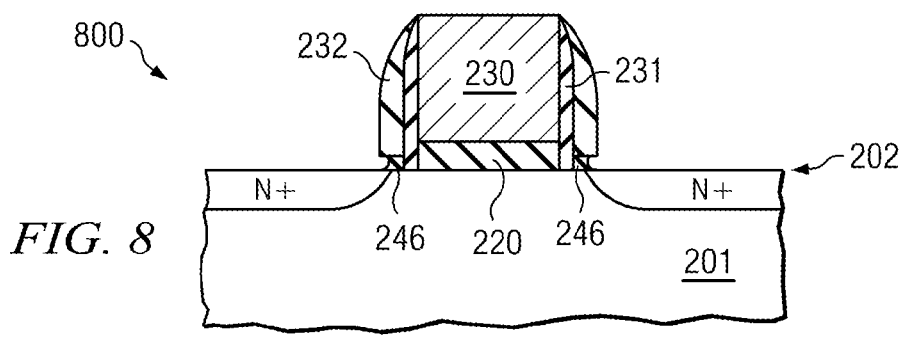
FIG. 8 depicts a cross sectional view of the resulting structure after removal of the remaining protective dielectric layer in a step referred to a short oxide removal that exposes the semiconductor surface in the LDD or S/D regions, according to a disclosed embodiment.
Figure 9:
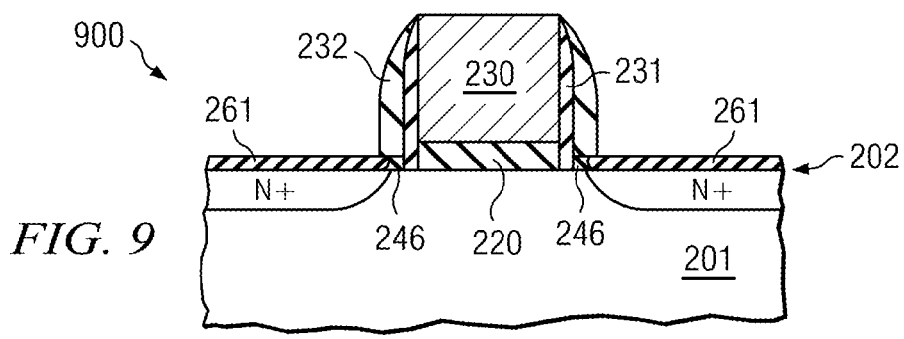
FIG. 9 depicts a cross sectional view of the resulting structure after replacement protective dielectric layer formation, according to a disclosed embodiment.
Figure 10:
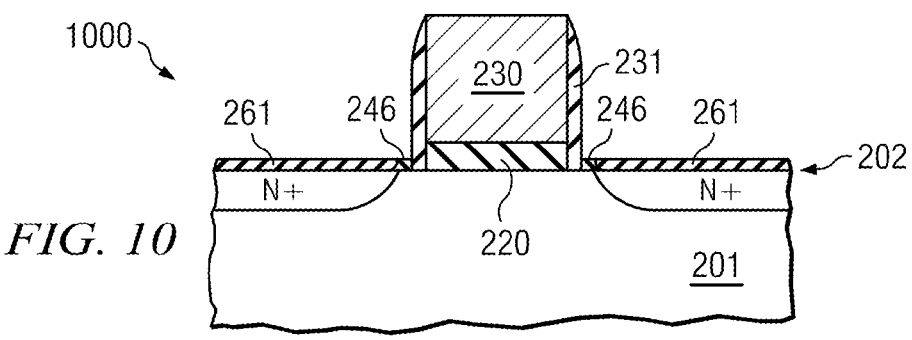
FIG. 10 depicts a cross-sectional view of the resulting structure after selective removal of the disposable nitride spacer, according to a disclosed embodiment.

FIGS. 8-10 are applicable specifically to the disposable nitride spacer embodiments. Beginning with the structure shown in FIG. 4, a photolithography pattern is added to allow selective implant to reach only certain regions (e.g. As implant in LDD or S/D regions for Low Vt NMOS devices) followed by the LDD or S/D implant. Pattern material (e.g., photoresist) removal follows the LDD or S/D implant. FIG. 8 depicts a cross sectional view of the resulting structure 800 after removal of the remaining protective dielectric layer 246 in a step referred to a short oxide removal in the case of a protective oxide layer that exposes the semiconductor surface in the LDD or S/D regions, such as using dilute HF in the case of a protective oxide.

FIG. 9 depicts a cross sectional view of the resulting structure 900 after replacement protective dielectric layer 261 formation. As described above, in the particular case of a solution-based chemical oxidation, the chemical oxidation step can be configured to oxidize the semiconductor surface in the LDD or S/D regions, but lack the oxidation power to oxidize the disposable nitride spacer. The wet chemistry for the solution-based oxidation step can comprise solutions such as SC1 (i.e., $NH_4OH$, $H_2O_2$, DIW mixture) or a sulfuric acid/hydrogen peroxide ($H_2SO_4$, $H_2O_2$) mixture.

FIG. 10 depicts a cross sectional view of the resulting structure 1000 after selective removal of the disposable nitride spacer 232, such as by hot phosphoric acid treatment. The etch selectivity of the process employed for removal of the disposable nitride spacer 232 is high enough to allow most of the replacement protective dielectric layer 261 to remain on the semiconductor surface 202, so that none of the LDD or S/D implanted into the semiconductor surface is removed during removal of the disposable nitride spacer 232.

Advantages of the disposable nitride spacer embodiments disclosed herein is the ability to utilize a nitride spacer, as opposed to a convention silicon oxide spacer. For example, when using convention silicon oxide spacers in STI flows, when removing or disposing of oxide sidewalls, the STI fill material becomes recessed. This recess quickly exposes the sidewall of the STI trench which becomes unacceptable. In addition, if the exposed semiconductor surface is not protected, even with the absolute minimum hot phosphoric etch time, the ion implanted semiconductor (e.g., silicon) surface can be consumed so that up to 30% of the implanted dose may be removed by the hot phosphoric etch. Although addition of a thermal anneal does recrystallize the ion implanted semiconductor, and may reduce its etch rate in hot phosphoric acid, such an anneal also generally changes the wet etch rate characteristics of the disposable nitride spacer film such that the disposable nitride spacer may become difficult to remove.

The active circuitry formed on the top semiconductor surface comprises circuit elements that generally include transistors, diodes, capacitors, and resistors, as well as signal lines and other electrical conductors that interconnect these various circuit elements.

Disclosed embodiments can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments can be used in a variety of processes including bipolar, CMOS, BiCMOS and MEMS.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A method of removing silicon nitride over semiconductors for forming shallow junctions, comprising:
   forming a gate stack on a substrate having a semiconductor surface, wherein a surface dielectric layer is on said semiconductor surface;
   forming sidewall spacers along sidewalls of said gate stack that together define lightly doped drain (LDD) regions or source/drain (S/D) regions within active areas of said semiconductor surface, wherein at least one of said sidewall spacers, said LDD regions and said S/D regions include an exposed silicon nitride layer, wherein a residual portion of said surface dielectric layer remains after said forming said sidewall spacers;
   removing said residual portion of said surface dielectric layer;
   forming a protective dielectric layer directly on said LDD regions or said S/D regions that is 0.8 nm to 8 nm;
   ion implanting said LDD regions to form lightly doped sources/drains or said S/D regions to form sources/drains using said sidewall spacers as implant masks, and
   selectively removing said exposed silicon nitride layer, wherein said protective dielectric layer protects said LDD regions or said S/D regions from dopant loss due to etching during said selectively removing.

2. The method of claim 1, wherein said LDD regions or said S/D regions comprise said LDD regions, and further comprising:
   forming an initial protective layer being 0.8 nm to 2 nm thick prior to said ion implanting; and
   stripping said initial protective dielectric layer after said ion implanting and prior to forming said protective dielectric layer, , said protective dielectric layer being 0.8 nm to 2 nm thick.

3. The method of claim 1, wherein said LDD regions or said S/D regions comprise said S/D regions, and further comprising:
   forming an initial protective layer being 0.8 nm to 2 nm thick prior to said ion implanting; and
   stripping said initial protective dielectric layer after said ion implanting and prior to forming said protective dielectric layer, , said protective dielectric layer being 0.8 nm to 2 nm thick.

4. The method of claim 1, wherein said selectively removing comprises hot phosphoric acid removal at a temperature between 110° C. and 200° C.

5. The method of claim 1, wherein said protective dielectric layer is formed by a process comprising solution-based chemical oxidization.

6. The method of claim 1, wherein said removing and said forming said protective dielectric layer comprises a single NH4OH, H2O2, and DI water (SC1) treatment.

7. The method of claim 1, wherein said exposed silicon nitride layer comprises a blanket screen nitride layer.

8. The method of claim 1, wherein said sidewall spacers comprise silicon nitride spacers.

9. The method of claim 1, wherein said sidewall spacers comprise silicon oxide spacers.

10. The method of claim 1, wherein said protective dielectric is formed by a process comprising a deposition.

11. The method of claim 10, wherein said deposition comprises atomic layer deposition (ALD).

12. The method of claim 1, wherein said protective dielectric layer is formed by a process comprising thermal oxidation.

13. The method of claim 1, wherein said gate stack comprises a polysilicon gate.

14. The method of claim 1, wherein said method further comprises:
   forming said sidewall spacers to define said LDD regions having a first exposed silicon nitride layer, first ion implanting said LDD regions and first selectively removing said first exposed silicon nitride over said LDD regions, and
   second forming said sidewall spacers to define said S/D regions having a second exposed silicon nitride layer, second ion implanting said S/D regions and second selectively removing said second exposed silicon nitride over said S/D regions.

15. The method of claim 1, wherein said semiconductor surface comprises silicon.

16. The method of claim 1, wherein said semiconductor surface comprises Ge, GaAs or InGaAs.

17. The method of claim 1, wherein said protective dielectric layer is a replacement protective dielectric layer.

18. A method of removing silicon nitride over silicon for forming shallow junctions, comprising:
   forming a gate stack on a substrate having a semiconductor surface, wherein a surface oxide layer is on said semiconductor surface;
   forming sidewall spacers along sidewalls of said gate stack that together define lightly doped drain (LDD) regions or source/drain (S/D) regions within active areas of said semiconductor surface, wherein at least one of said sidewall spacers, said LDD regions and said S/D regions include an exposed silicon nitride layer, wherein a residual portion of said surface oxide layer remains after said forming said sidewall spacers;
   removing said residual portion of said surface oxide layer;
   forming a protective oxide layer directly on said LDD regions or said S/D regions that is 0.8 nm to 8 nm;
   ion implanting said LDD regions to form lightly doped sources/drains or said S/D regions to form sources/drains using said sidewall spacers as implant masks, and
   selectively removing said exposed silicon nitride layer, wherein said protective oxide layer protects said LDD regions or said S/D regions from dopant loss due to etching during said selectively removing,
   wherein said protective oxide layer is formed by a process comprising a solution-based chemical oxidization.

19. The method of claim 18, wherein said protective oxide layer is a replacement protective dielectric layer.

* * * * *